United States Patent
Ren et al.

(10) Patent No.: US 7,591,913 B2
(45) Date of Patent: Sep. 22, 2009

(54) THERMOELECTRIC PROPERTIES BY HIGH TEMPERATURE ANNEALING

(75) Inventors: Zhifeng Ren, Newton, MA (US); Gang Chen, Carlisle, MA (US); Shankar Kumar, Watertown, MA (US); Hohyun Lee, Cambridge, MA (US)

(73) Assignees: Massachusetts Institute of Technology, Cambridge, MA (US); The Trustees of Boston College, Chestnut Hill, MA (US)

( * ) Notice: Subject to any disclaimer, the term of this patent is extended or adjusted under 35 U.S.C. 154(b) by 421 days.

(21) Appl. No.: 11/100,950

(22) Filed: Apr. 6, 2005

(65) Prior Publication Data
US 2005/0252582 A1 Nov. 17, 2005

Related U.S. Application Data

(60) Provisional application No. 60/559,763, filed on Apr. 6, 2004.

(51) Int. Cl.
*C22C 1/00* (2006.01)
*H01L 21/00* (2006.01)
(52) U.S. Cl. ............... 148/512; 438/54; 438/48
(58) Field of Classification Search .......... 148/512; 438/54, 48
See application file for complete search history.

(56) References Cited

U.S. PATENT DOCUMENTS

| | | | |
|---|---|---|---|
| 4,126,732 A | 11/1978 | Schoolar et al. | |
| 5,531,936 A | 7/1996 | Kanatzidis et al. | |
| 5,614,128 A | 3/1997 | Kanatzidis et al. | |
| 5,618,471 A | 4/1997 | Kanatzidis et al. | |
| 5,897,945 A | 4/1999 | Lieber et al. | |

(Continued)

FOREIGN PATENT DOCUMENTS

DE 19627389 1/1997

(Continued)

OTHER PUBLICATIONS

Yamashita, et al., "Effect of Annealing on Thermoelectric Properties of Bismuth Telluride Compounds Doped with Various Additives", Journal of Applied Physics, vol. 95(1), 161-9, 2004.

(Continued)

*Primary Examiner*—Roy King
*Assistant Examiner*—Jie Yang
(74) *Attorney, Agent, or Firm*—Thomas J. Engellenner; Reza Mollaaghababa; Nutter McClennen & Fish LLP

(57) ABSTRACT

The present invention generally provides methods of improving thermoelectric properties of alloys by subjecting them to one or more high temperature annealing steps, performed at temperatures at which the alloys exhibit a mixed solid/liquid phase, followed by cooling steps. For example, in one aspect, such a method of the invention can include subjecting an alloy sample to a temperature that is sufficiently elevated to cause partial melting of at least some of the grains. The sample can then be cooled so as to solidify the melted grain portions such that each solidified grain portion exhibits an average chemical composition, characterized by a relative concentration of elements forming the alloy, that is different than that of the remainder of the grain.

23 Claims, 13 Drawing Sheets

U.S. PATENT DOCUMENTS

| | | | |
|---|---|---|---|
| 5,973,050 | A | 10/1999 | Johnson et al. |
| 6,013,204 | A | 1/2000 | Kanatzidis et al. |
| 6,312,617 | B1 | 11/2001 | Kanatzidis et al. |
| 6,444,896 | B1 | 9/2002 | Harman et al. |
| 6,605,772 | B2 | 8/2003 | Harman et al. |
| 6,670,539 | B2 | 12/2003 | Heremans et al. |
| 6,977,182 | B2 | 12/2005 | Sato et al. |
| 7,002,071 | B1 * | 2/2006 | Sadatomi et al. ............ 136/239 |
| 7,255,846 | B2 | 8/2007 | Ren et al. |
| 2002/0026856 | A1 | 3/2002 | Suzuki et al. |
| 2002/0053359 | A1 | 5/2002 | Harman et al. |
| 2002/0170590 | A1 | 11/2002 | Heremans et al. |
| 2003/0047204 | A1 | 3/2003 | Fleurial et al. |
| 2006/0110313 | A1 | 5/2006 | Cho et al. |

FOREIGN PATENT DOCUMENTS

| | | |
|---|---|---|
| JP | 9025526 | 1/1997 |
| JP | 2003251600 | 9/2003 |
| WO | WO-0012600 | 3/2000 |

OTHER PUBLICATIONS

D. Emin et al., Materials Research Society Proceedings, vol. 97, 341-52, 1987.

Chen et al., "Recent Developments in Thermoelectric Materials," International Materials Reviews, vol. 48, pp. 45-66, (2003).

Hsu et al., "Cubic AgPb.sub.mSbTe.sub.2+m: Bulk Thermoelectric Materials with High Figure of Merit," Science, vol. 303, p. 818-821, (Feb. 2004).

Heremans et al., "Thermopower Enhancement in Lead Telluride Nanostructures," Physical Review, vol. 70, p. 115334-1-115334-5, (Sep. 2004).

Science vol. 271, "Small Clusters Hit the Big Time," 920-922 (Feb. 20, 1996).

Ngiam et al., J. Appl. Phys.. "Synthesis of Ge nanocrystals embedded in a Si host matrix," 76, 8201-8203 (1994).

Zhu et al., J. Appl. Phys., "Coexisting photoluminescence of Si and Ge nanocrystals in Ge/Si thin film," 90, 5318-5321 (2001).

Taylor et al., "Solution Synthesis of Germanium Nanocrystals Demonstrating Quantum Confinement," Chem. Mater. 10, 22-24 (1998).

Murray et al., "Synthesis and Characterization of Nearly Monodisperse CdE (E=S, Se, Te) Semiconductor Nanocrystallites," J. Am. Chem. Soc. 1993, 115, 8706-8715.

Kane et al., J. Phys. Chem., "Theoretical Study of the Electronic Structure of PbS Nanoclusters," 1996, 100, 7928-7932.

Pan et al., "Nanobelts of Semiconducting Oxides," Science 2001, 291, 1947-1949.

Ebbesen et al., "Large-scale synthesis of carbon nanotubes," Nature 1992, 358, 220-222.

Lao et al., "Zn0 Nanobridges and Nanonails," Nano Lett. 2003, 3, 235-238.

Li et al., "MoS.sub.2 nanoflowers and their field-emission properties," Appl. Phys. Lett. 2003, 82, 1962-1964.

Sun et al., "Shape-Controlled Synthesis of Gold and Silver Nanoparticles," Science 2002, 298, 2176-2179.

Saito et al., "Carbon nano-cages created as cubes," Nature 1998, 392, 237-238.

Maeda et al., "Visible photoluminescence of Ge microcrystals embedded in Si0.sub.2 glassy matrices," Appl. Phys. Lett. 1991, 59, 3168-3170.

Paine et al., "Visible photoluminescence from nanocrystalline Ge formed by H.sub.2 reduction of Si.sub.0.6Ge.sub.0.4O.sub.2," Appl. Phys. Lett. 1993, 62, 2842-2844.

Bettotti et al., "Silicon nanostructures for photonics," J. Phys.: Condens. Matter 2002, 14, 8253-8281.

She et al., "Impact of Crystal Size and Tunnel Dielectric on Semiconductor Nanocrystal Memory Performance," IEEE Trans. Electron Dev. 2003, 50, 1934-1940.

Bostedt et al., "Evidence for cubic phase in deposited germanium nanocrystals," J. Phys.: Condens. Matter 2003, 15, 1017-1028.

Oku et al., "Formation and photoluminescence of Ge and Si nanoparticles encapsulated in oxide layers," Mater. Sci. Eng. B. 2000, B74, 242-247.

Lin et al., "Structural and optical properties of germanium nanoparticles," J. Appl. Phys. 2002, 91, 1525-1528.

Das et al., "Self-assembled Ge nanostructures on polymer-coated silicon: Growth and characterization," Appl. Phys. Lett. 2000, 77, 951-953.

Zhu et al., "Enhancement of photoluminesence in Ge nanoparticles by neighboring amorphous C in composite Ge/C thin films," J. Appl. Phys. 2003, 93, 6029-6033.

Yang et al., "Sol-Gel Preparation and Photoluminescence of Size Controlled Germanium Nanoparticles Embedded in a SiO.sub.2 Matrix," J. Phys. Chem B 2003, 107, 13319-13322.

Taylor et al., "Solution Synthesis and Characterization of Quantum Confined Ge Nanoparticles," Chem. Mater. 1999, 11, 2493-2500.

Taylor et al., "Solution preparation of Ge nanoparticles with chemically tailored surfaces," Mater. Sci. Eng. B 2002, B96, 90-93.

Hope-Weeks, "Time dependent size and shape control of germanium nanocrystals," Chem. Commun. 2003, 2980-2981.

Wilcoxon et al., "Synthesis and optical properties of collodial germanium nanocrystals," Phys. Rev. B 2001, 64, 035417-1-035417-9.

Kornowski et al., "nanometer-Sized Colloidal Germanium Particles: Wet-Chemical Synthesis, Laser-Induced Crystallization and Particle Growth," Adv. Mater. 1993, 5, 634-636.

Gerion et al., "Solution Synthesis of Germanium Nanocrystals: Success and Open Challenges," Nano Lett. 2004, 4, 597-602.

Lu et al., "Sythesis of Germanium Nanocrystals in High Temperature Supercritical Fluid Solvents," Nano Lett. 2004, 5 969-974.

Peng et al., "Mechanisms of the Shape Evolution of CdSe Nanocrystals," J. Am. Chem. Soc. 2001, 123, 1389-1395.

Pileni, "The role of soft colloidal templates in controlling the size and shape of inorganic nanocrystals," Nat. Mater. 2003, 2, 145-150.

Johnson et al., "Growth and form of gold nanorods prepared by seed-mediated, surfactant-directed synthesis," J. Mater. Chem. 2002, 12, 1765-1770.

Goldsmid, "Thermoelectric Refrigeration," Plenum Press, New York, 1964.

Chen et al., "Heat Transfer in Nanostructures for Solid-State Energy Conversion," ASME Journal of Heat Transfer, 2002, 124, pp. 242-252.

Ioffe, "Semiconductor Thermoelements and Thermoelectric Cooling, Infosearch Limited," London, 1957.

Harman et al., "Thermoelectric Quantum-Dot Superlattices with High ZT," Journal of Electronic Materials, 29, pp. L1-L4, 2000.

Venkatasubramanian et al., "Thin-film thermoelectric devices with high room-temperature figures of merit," Nature, 413, pp. 597-602, 2001.

Hicks et al., "Effect of quantum-well structures on the thermoelectric figure of merit," Physical Review B, 47, pp. 12727-12731, 1993.

Hicks et al., "Experimental study of the effect of quantum-well structures on the thermoelectric figure of merit," Physical Review B, 53, 10493-10496, 1996.

Koga et al., "Experimental proof-of-principle investigation of enhanced Z.sub.3DT in (001) oriented Si/Ge superlattices," Applied Physics Letters, 77, pp. 1490-1492, 2000.

Springholz et al., "Self Organized Growth of Three-Dimensional Quantum-Dot Crystals With fcc-Like Stacking and a Tunable Lattice Constant," Science, 282, pp. 734-737, 1998.

Chen, "Thermal conductivity and ballistic-phonon transport in the cross-plane direction of superlattices," Applied Physics Letters, 77, pp. 1490-1492, 2000.

Goodson et al., "Heat Conduction in Novel Electronic Films" Annual Review of Materials Science, 29, pp. 261-293, 1999.

Venkatasubramanian, "Lattice thermal conductivity reduction and phonon localizationlike behavior in superlattice structures," Physical Review B, 61, pp. 3091-1097, 2000.

Song et al., "Thermal Conductivity of skutterudite thin films and superlattices," Applied Physics Letters, 77, pp. 3854-3856, 2000.

Murray et al., "Synthesis and Characterization of Monodisperse Nanocrystals and Close-Packed Nanocrystal Assemblies," Annual Review of Materials Science, 30, pp. 545-610, 2000.

Fang et al., "Nanocrystalline bismurth synthesized via an in situ polymerization-microemulsion process," Materials Letters, 42, pp. 113-120, 2000.

Foos et al., "Synthesis of Nanocrystalline Bismuth in Reverse Micelles," Journal of the American Chemical Society, 122, pp. 7114-7115, 2000.

Fang et al., "Self-assembled bismuth nanocrystallites,"Chemical Communication, pp. 18-72-1873, 2001.

Mulvaney et al., "Surface Chemistry of Colloidal Gold—Deposition of Lead and Accompanying Optical Effects," Journal of Physical Chemistry, 96, pp. 10419-10424, 1992.

Mulvaney et al., "Silica encapsulation of quantum dots and metal clusters," Journal of Materials Chemistry, 10, pp. 1259-1270, 2000.

Lieber, "One-Dimensional Nanostructures: Chemistry, Physics & Applications," Solid State Communication, 107, pp. 607-616, 1998.

Morales et al., "A Laser Ablation Method for the Synthesis of Crystalline Semiconductor Nanowires," Science, 279, pp. 208-211, 1998.

Wei et al., "Synthesis of Single Crystal Bismuth-Telluride and Lead-Telluride Nanowires for New Thermoelectric Materials," MRS Proc., V. 581, pp. 219-223, 2000.

Gudiksen et al., "Growth of nanowire superlattice structures for nanoscale photonics and electronics," Nature, 415, pp. 617-620, 2002.

Wu et al., "Block-by-Block Growth of Single-Crystalline Si/SiGe Superlattice Nanowires," Nanoletters, 2, pp. 83-86, 2002.

Zhang et al., "Processing and Characterization of Single-Crystalline Ultrafine Bismuth Nanowires," Chemistry of Materials, 11, pp. 1659-1665, 1999.

Heremans et al., "Bismuth nanowires arrays: Synthesis and galvanomagnetic properties," Physical Review B, 61, pp. 2921-2930, 2000.

Sapp et al., "Template Synthesis of Bismuth Tellride Nanowires," Advanced Materials, 11, pp. 402-404, 1999.

Prieto et al., "Electrodeposition of Ordered $Bi_2Te_3$ Nanowire Arrays," Journal of the American Chemical Society, 123, pp. 7160-7161, 2001.

Takahashi et al., "Electrodeposition of PBS Films From Acidic Solution," Journal of Electroanalytical Chemistry, 359, pp. 281-286, 1993.

Molin et al., "Electrochemical deposition of PbSe thin-films from aqueous-solutions," Thin Solid Films, 265, pp. 3-9, 1995.

Saloniemi et al., "Electrodeposition of lead selenide thin films," Journal of Materials Chemistry, 8, pp. 651-654, 1998.

Saloniemi et al., "Electrodeposition of PbTe thin films," Thin Solid Films, 326, pp. 78-82, 1998.

Routkevitch et al., "Nonlithographic Nano-Wire Arrays: Fabrication, Physics, and Device Applications," IEEE Transactions on Electron Devices, 43, pp. 1646-1658, 1996.

Ren et al., "Synthesis of Large Arrays of Well-Aligned Carbon Nanotubes on Glass," Science 282, pp. 1105-1107, 1998.

Yang et al., "Geometric Effects on the Transient Cooling of Thermoelectric Coolers," MRS Proc., vol. 691, pp. G8.27.1-G8.27.6 (2002).

Jacquot et al., "Fabrication and Modeling of a Thermoelectric Microgenerator," $21^{st}$ International Conference on Thermoelectroncis, pp. 561-564 (2002).

Chen, G., "Size and Interface Effects on Thermal Conductivity of Superlattices and Periodic Thin-Film Structures," ASME Journal of Heat Transfer, vol. 119, pp. 220-229, 1997.

Yang et al., Lattice Dynamics Study of Anisotropic Heat Conduction in Superlattices, Microscale Thermophysical Engineering, vol. 5, pp. 107-116, 2001.

Mrotzek et al., "Search for New Thermoelectric Materials through Exploratory Solid State Chemistry. The Quaternary Phases $A_{1+x}M_{3-2x}Bi_{7+x}Se_{14}, A_{1-x}M_{3-x}Bi_{11+x}Se_{20}, A_{1-x}M_{4-x}Bi_{11+x}Se_{21}$ and $A_{1-x}M_{5-x}Bi_{11+x}Se_{22}$ (A=K, Rb, Cs, M=Sn, Pb) and the Homologous Series $A_m[M_6Se_8]_m[M_{5+n}Se_{9=n}]$" MRS Proceedings, 691, pp. G.5.1.1-G.5.1.12 (2001).

Ghamaty et al., "Theraml and Electrical Properties of $Si/Si_{0.8}Ge_{0.2}$ and $B_4C/B_9C$ Films,"Proc. ICT98, pp. 206-209.

Bennett, G.L., "Space Applications, in CRS Handbook of Thermoelectrics," Ed.D.M. Rowes, CRC Press, Boca Raton, pp. 515-537 (1995).

Kanatzidis, M.G., "New Bulk Materials for Thermoelectric Applications: Synthetic Strategies Based on Phase Homologies," Michigan State University (2003).

Borca-Tasciuc et al.. "Thermal conductivity of symmetrically strained Si/Ge superlattices."

Koga et al., "Mechanism of the enhanced thermoelectric power in (111)-oriented n-type $PbTe/Pb_{1-x}Eu_xTe$ multiple quantum wells," Phys. Rev. B., 1999, 60, 14286-14293.

Vining, C.B., "Silicon Germanium," in CRC Handbook of Thermoelectrics, ed. Rowe, D.M., CRC Press, Boca Raton, pp. 328-337 (1995).

Scoville et al., "Thermal Conductivity Reduction in SiGe Alloys by the Addition of Nanophase Particles," Nanostructured Materials, 5, 207-23, 1995.

Rowe et al., "Comments on the thermoelectric properties of pressure-sintered $Si_{0.8}Ge_{0.2}$ thermoelectric alloys," Journal of Applied Physics, v. 73, pp. 4683-4685 (1993).

Harman et al., "Quantum Dot Superlattice Thermoelectric Materials and Devices," Science 297, pp. 2229-2232 (2002).

Sun et al., "Experimental Study of the Effect of the Quantum Well Structures on the Thermoelectric Figure of Merit in $Si/Si_xGe_{1-x}$ System," Proceedings of Int. Conf. Thermoelectrics, ICT'99, pp. 652-655 (1999).

Morup et al., "Crystal growth and the steady-state grain size during high-energy ball milling," Europhysics Letters, 56, pp. 441-446 (2001).

Lam et al., "Large-scale synthesis of ultrafine Si nanoparticles by ball milling," Journal of Crystal Growth, 220, pp. 466-470 (2000).

Lao et al. "Hierarchical ZnO Nanostructures," Nano letters, pp. 1287-1291 (2002).

Lai et al., "Melting point depression of Al clusters generated during the early stages of film growth: Nanocalorimetry measurements," Applied Physics Letters, 72, pp. 1098-1100 (1998).

Lu et al., "Melting and superheating of low-dimensional materials," Current Opinion in Solid State and Materials Science, 5, pp. 39-44 (2001).

Yang et al., "Measurement of anisotropic thermoelectric properties in superlattices," Applied Physics Letters, 81, pp. 3588-3590 (2002).

Lin et al., "Semimetal-semiconductor transition in $Bi_{1-x}Sb_x$ alloy nanowires and their thermoelectric properties," Applied Physics Letters, 81, pp. 2403-2405 (2002).

Borca-Tasciuc et al., "Thermal Conductivity of InAs/AISb Superlattices," Microscale Thermophysical Engineering, 5, pp. 225-231 (2001).

Ovsyannikov, S.V., Shchennikov, V.V., Ponosov, Y.S., Gudina, S. V., Guk, V.G., Skipetrov, E.P., Mogilenskikh, V.E., J. Phys. D: Appl. Phys., 2004, 37, 1151.

Hsu, K.F., Loo, S., Guo, F., Chen. W., Dyck, J.S., Uher, C., Hogan, T., Polychroniadis, E.K., Kanatzidis, M.G., Science, 2004, 303, 818.

Hicks, L. D., Dresselhaus, M.S., Phys. Rev. B, 1993, 47, 12727.

Hicks, L. D., Dresselhaus, M.S., Phys. Rev. B, 1993, 47, 16631.

Hicks, L.D., Harman, T.C., Sun, X., Dresselhaus, M.S., Phys. Rev. B 1996, 53, R10493.

Gou, L.F., Murphy, C.J., Nano Lett., 2003, 231-234.

Caruso, F., Caruso, R.A., Mohwald, H., Science, 1998, 282, 1111.

Goltner, C.G., Angew. Chem., 1999, 111, 3347; Angew. Chem. Int. Ed., 1999, 38, 3155.

Sun, Y., XIA, Y., Science, 2002, 298, 2716.

Sun, Y., Mayers, B., XIA, Y., Adv. Mater., 2003, 15, 641.

Dinsmore, A.D., Hsu, M.F., Nikolaides, M.G., Marquez, M., Bausch, A.R., Weitz, D.A., Science, 2002, 298, 1006.

Caruso, F., Shi, X.Y., Caruso, R.A., Susha, A., Adv. Mater., 2001, 13, 740.

Breen, M.L., Dinsmore, A.D., Pink, R.H., Qadri, S.Q., Langmuir, B.R., 2001, 17, 903.

Kim, S.W., Kim, M., Lee, W.Y., Hyeon, T., J. Am. Chem. Soc., 2002, 124, 7642.

Dia, Z., Dahne, L., Mohwald, H., Tiersch, B., Angew. Chem. Int. Ed., 2002, 41, 4019.

Yang, Z., Niu, Z., Lu, Y., Hu, Z., Han, C.C., Angew. Chem. Int. Ed., 2003, 42, 1943.

Zhu, J.J., Xu, S., Wang, H., Zhu, J.M., Chen, H.Y., Adv. Mater., 2003, 15, 156.

Kobayashi, S., Hamasaki, N., Suzuki, M., Kimura, M., Shirai, H., Hanabusa, K., J. Am. Chem. Soc., 2002, 124, 6550.

Collins, A.M., Spickermann, C., Mann, S., J. Mater. Chem., 2003, 13, 1112.

Blin, J.L., Leonard, A., Yuan, Z.Y., Gigot, L., Vantomme, A., Cheetham, A.K., Su, B.L., Angew. Chem. Int. Ed., 2003, 42, 2872.

Yuan, Z.Y., Ren, T.Z., Su, B.L., Adv. Mater., 2003, 15, 1462.

Deng, Y., Nan, C.W., Wei, G.D., Guo, L., Lin, Y.H., Chem. Phys. Lett., 2003, 374, 410.

Cao, M.H., Wang, Y.H., Guo, C.X., Qi, Y.J., Hu, C.W., Wang, E.B., J. Nanosci. Nanotec., 2004, 4, 824.

Yu, D.B., Yam V.W.W., J. Am. Chem. Soc., 2004, 126, 13200.

Hu, J.S., Guo, Y.G., Liang, H.P., Wan, L.J., Bai, C.L., Wang, Y.C., J. Phys. Chem. B 2004, 108, 9734.

Liz-Marsan et al., "Core-Shell Nanoparticles and Assemblies Thereof," Handbook of Surfaces and Interfaces of Materials edited by H.S. Nalawa, Academic Press, pp. 197-204 and 211-218, 2001.

Rowe, D.M., Ed., *Handbook of Thermoelectrics*, CRC Press, Boca Raton, Florida, 1995.

* cited by examiner

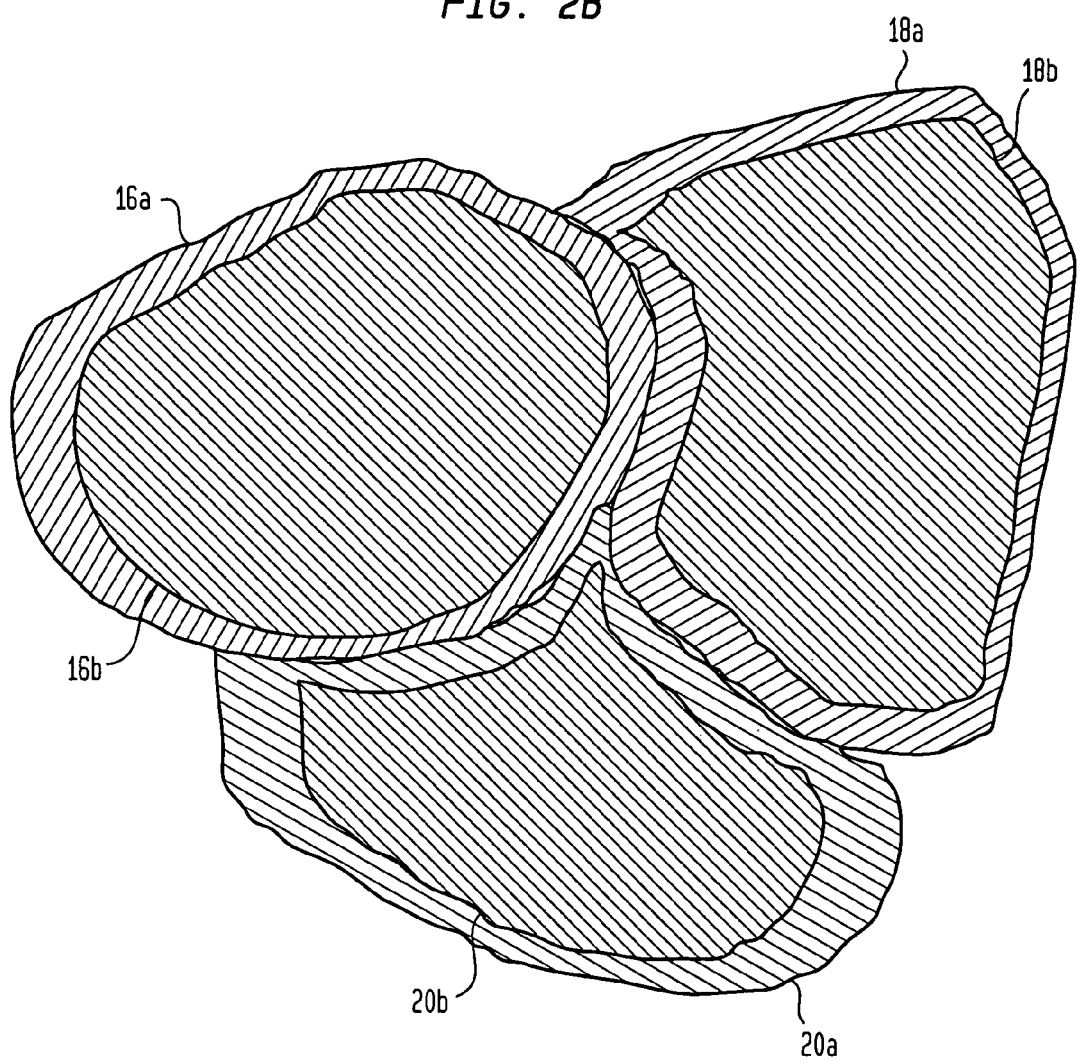

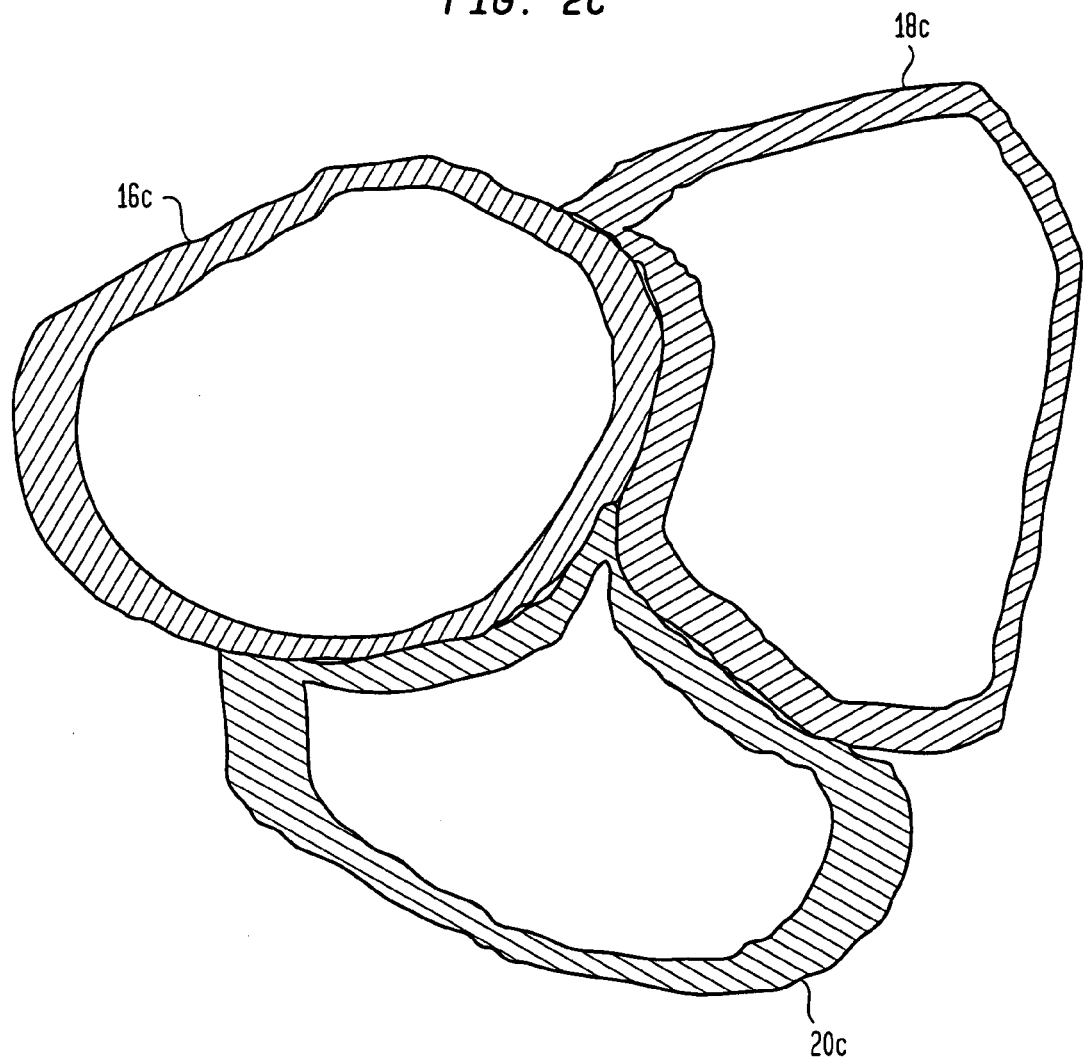

ORIGINAL

ANNEALED ONCE

ANNEALED TWICE

Sb-Te

THERMOELECTRIC PROPERTIES BY HIGH TEMPERATURE ANNEALING

RELATED APPLICATION

The present application claims priority to a provisional application entitled "Improving thermoelectric properties by high temperature annealing" filed on Apr. 6, 2004 and having a Ser. No. 60/559,763.

FEDERALLY SPONSORED RESEARCH

This invention was made with government support awarded by NASA under Grant Numbers NAS3-03108 and NASA-5000486. The government has certain rights in the invention.

BACKGROUND

The present invention is generally directed to thermoelectric materials, and more particularly, to methods for enhancing thermoelectric properties of alloys.

Thermoelectric effects are routinely employed in cooling or power generation applications. For example, thermoelectric devices that utilize Seebeck effect or Peltier effect for power generation and heat pumping are known. A variety of alloys that exhibit thermoelectric properties can be utilized for fabricating such devices. A thermoelectric figure-of-merit $$(Z = \frac{S^2 \sigma}{k},$$

where S is the Seebeck coefficient, $\sigma$ is the electrical conductivity, and k is the thermal conductivity) is typically employed as the indicator of an alloy's thermoelectric properties. In some cases, a dimensionless figure-of-merit (ZT) is employed, where T can be an average temperature of the thermoelectric material. An alloy's thermoelectric properties can in turn affect coefficient-of-performance (COP) and efficiency of thermoelectric devices in which the allhoy is incorporated.

Accordingly, there is a need for improving thermoelectric properties of alloys, especially those that are routinely utilized in fabricating thermoelectric devices.

SUMMARY

The present invention generally provides methods of improving thermoelectric properties of alloys by subjecting them to one or more high temperature annealing steps, performed at temperatures at which the alloys exhibit a mixed solid/liquid phase, followed by cooling steps. For example, in one aspect, such a method of the invention can include subjecting an alloy sample having a plurality of grains to a temperature that is sufficiently elevated to cause partial melting of at least some of the grains. The sample can then be cooled so as to solidify the melted grain portions such that each solidified grain portion exhibits a chemical composition, e.g., characterized by relative concentrations of elements forming the alloy, that is different than that of the remainder of the grain. The chemical composition of an alloy region can be characterized by an average relative concentration of the elements, which form the alloy, within that region.

The term "alloy" generally refers to a compound that is composed of two or more elements. As this term is used herein, these elements can be metals or non-metals (e.g., semiconductors). For example, an alloy, as used herein, can refer to a compound composed of two or more elements in which chemical bonds are formed between atoms of the different elements. Some examples of alloys suitable for use in the practice of the invention include, without limitation, silicon/germanium, bismuth/tellurium, lead/selenium, antimony/tellurium and lead/tellurium, etc.

In a related aspect, the elevated temperature can be selected to be greater than a first threshold temperature below which the alloy would exhibit a purely solid phase and less than a second threshold temperature above which the alloy would exhibit a purely liquid phase. For example, the temperature can be selected such that a point in a phase diagram of an alloy sample of interest corresponding to that temperature lies above a curve separating a purely solid thermodynamic phase from a mixed solid/liquid phase and below a curve separating the solid/liquid phase from a purely liquid phase.

In another aspect, the alloy is subjected to the elevated temperature for a duration such that each melted portion of a grain comprises a volume fraction of that grain less than about 50%. For example, the volume fraction can be in a range of about 1% to about 50%. In many embodiments, the duration of the high temperature anneal can be in a range of about 1 minute to about 30 minutes, or in a range of about 1 minute to about 20 minutes. It should be understood that other time durations can also be employed so long as substantial deformation of the sample can be avoided.

In another aspect, the alloy is maintained in an inert atmosphere while exposing it to the above-described elevated temperature so as to inhibit oxidation. By way of example, the inert atmosphere can be established, for example, by flowing an inert gas, e.g., argon, over the alloy, or placing the alloy in a closed chamber filled with such an inert gas.

In another aspect, the present invention provides a method of enhancing a thermoelectric property of an alloy having a polycrystalline structure characterized by a plurality of grains by annealing the alloy at a temperature that is sufficiently elevated to cause a solid-to-liquid phase change at the periphery of a plurality of the grains such that liquefied boundary layers are formed that exhibit an average chemical composition different from that of unliquified core portions of corresponding grains (the core portions retain their solid phase at the elevated temperature). The alloy is then cooled to solidify the liquid boundary layers.

In a related aspect, the elevated temperature can be selected to be in a range in which the alloy would exhibit a mixed solid/liquid thermodynamic phase, e.g., above temperatures at which the alloy's phase diagram (corresponding to a particular elemental composition of an alloy sample undergoing annealing) exhibits a purely solid phase and below temperatures at which the phase diagram exhibits a purely liquid phase.

The duration of the annealing step can be selected such that a liquefied grain boundary layer would comprise a fraction of the grain volume less than about 50%, e.g., in a range of about 1% to about 50%. For example, the annealing duration can be in a range of about 1 minute to about 30 minutes, or in a range of about 1 minute to about 20 minutes.

In another aspect, the present invention provides a method of improving a thermoelectric figure-of-merit of a polycrystalline alloy sample that is characterized by a plurality of grains. The method calls for annealing the alloy at a sufficiently elevated first temperature so as to liquefy peripheral layers of a plurality of its grains while maintaining their core portions in a solid phase. This is followed by cooling the sample to solidify the liquefied layers into shells surrounding the cores. Each shell has an average chemical composition, e.g., characterized by relative concentrations of the elements forming the alloy, that is different than that of the core it surrounds. Subsequently, the alloy is annealed again at an elevated temperature that is less than the first anneal temperature but still sufficiently high so as to liquefy peripheral layers of the grain shells, generated in the previous annealing/cooling cycle, while maintaining the remainder of the shells and their associated cores in a solid phase. The second annealing step can then be followed by cooling the sample to solidify the liquefied peripheral layers. In this manner, the resultant grains include three compositional phases: a core portion, a shell surrounding the core and a boundary layer that in turn surrounds the shell. That is, the above annealing/cooling cycles enhance the compositional heterogeneity of the sample.

In a related aspect, the annealing temperatures are selected to be in a range in which the alloy exhibits a mixed solid/liquid phase. For example, the first annealing temperature can be selected to be greater than temperatures at which a phase diagram of the alloy corresponding to the elemental composition of the alloy sample exhibits a purely solid phase and less than temperatures at which the phase diagram of the sample exhibits a purely liquid phase. Further, the second annealing temperature can be selected to be greater than temperatures at which the alloy's phase diagram corresponding to the elemental composition of the grain shells, formed in the previous annealing/cooling cycle, exhibits a purely solid phase and less than temperatures at which the phase diagram corresponding to the elemental composition of the grain shells exhibits a purely liquid phase.

The number of iterations of the annealing/cooling cycles is not limited to that described above but can be selected based on, among other factors, the type of alloy, the degree of desired enhancement of compositional heterogeneity, and the phase diagram of the alloy.

In another aspect, the present invention provides a thermoelectric composition comprising a polycrystalline alloy that is composed of at least two chemical elements and is characterized by a plurality of crystalline grains. At least some of the grains have peripheral portions surrounding core portions such that each peripheral portion exhibits an average relative concentration of the two elements that is different from that of its corresponding core portion.

In a related aspect, some of the peripheral portions of the thermoelectric composition can exhibit a multi-shell structure such that different shells have different chemical compositions, e.g., characterized by different relative concentrations of elements forming the alloy.

In another aspect, the present invention provides a method of reducing thermal conductivity in a thermoelectric alloy with a plurality of grains by thermally cycling the alloy between an upper temperature in which the alloy exhibits a mixed liquid-solid phase and a lower temperature in which the alloy exhibits a solid phase such that at least a plurality of the grains are partially melted and peripheral boundary layers are formed around the partially melted grains. The boundary layers have a different chemical composition than core regions of the partially melted grains. The thermal cycling can be repeated so as to form multiple shells around at least some of the partially melted grains, wherein each shell has a different chemical composition.

DETAILED DESCRIPTION

The present invention is generally directed to methods for enhancing thermoelectric properties of alloys and the resultant enhanced thermoelectric compositions. In many embodiments, an alloy sample can be subjected to an elevated temperature to cause partial melting of its grains, especially at portions proximate to grain boundaries such that the melted portions would exhibit a different average chemical composition than those of the core portions of the grains. The alloy sample can then be cooled to solidify the melted portions, thereby imparting an enhanced compositional heterogeneity thereto. It has been discovered that this process of partial melting followed by solidification can enhance the alloy's thermoelectric properties, as discussed in more detail below. Exemplary embodiments of the invention described below further elucidate various aspects of the invention.

Figure 1:
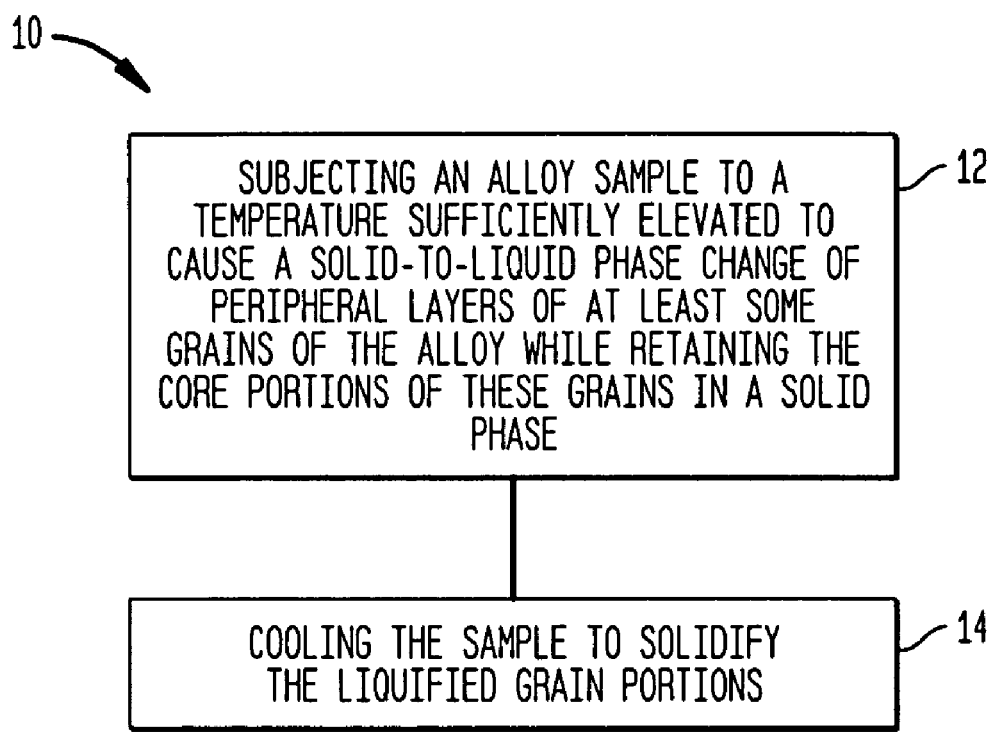
FIG. 1 is a flow chart depicting various steps in a method according to an exemplary embodiment of the invention for improving thermoelectric properties of an alloy, FIG. 2A schematically illustrates a few grains of an alloy sample prior to application of the method described in FIG. 1, FIG. 2B schematically illustrates the grains of FIG. 2 after application of a high temperature annealing step according to the method of FIG. 1 has caused melting of peripheral layers of the grains, FIG. 2C schematically illustrates the grains of FIG. 3 after solidification of the melted grain portions, FIG. 3 schematically depicts a grain of an alloy subjected to an high temperature annealing and cooling cycle according to an embodiment of the invention, exhibiting three compositional regions characterized by a core, a peripheral shell and a gradient region connecting the shell to the core.

With reference to a flowchart 10 of FIG. 1, in a method according to one exemplary embodiment of the invention for improving a thermoelectric property of an alloy, in step 12, a solid sample of the alloy is subjected to a temperature that is sufficiently elevated to cause a solid-to-liquid phase change of peripheral layers (herein also referred to as boundary layers) of at least some grains forming the alloy's polycrystalline structure while ensuring that core portions of these grain retain their solid phase. The temperature is selected such that each liquefied grain boundary layer would exhibit an average chemical composition that is different than that of its associated core portion, which maintains its solid phase at the elevated temperature. Subsequently, in step 12, the alloy sample is cooled so as to solidify the liquid peripheral grain layers.

In many embodiments, the high temperature annealing step can be performed in an inert atmosphere, e.g., an atmosphere of argon, to inhibit oxidation of the sample, which may otherwise readily occur at the elevated annealing temperature. The inert atmosphere can be established, for example, by flowing an inert gas over the sample or placing the sample in an enclosure filled with an inert gas. In other embodiments, the annealing step can be performed in a non-inert atmosphere. Further, the ambient pressure can be selected to be at any suitable value, e.g., in a range of about 10 Torr to about 2 atm.

In many embodiments, the above elevated annealing temperature is selected to be higher than temperatures at which a phase diagram of the alloy corresponding to the average chemical composition of the sample exhibits a purely solid phase and less than those temperatures at which the phase diagram exhibits a purely liquid phase. In other words, the elevated temperature can be chosen to be in a range in which the alloy sample exhibits a mixed solid/liquid phase (i.e., a phase characterized by a mixture of solid and liquid).

Figure 2A:
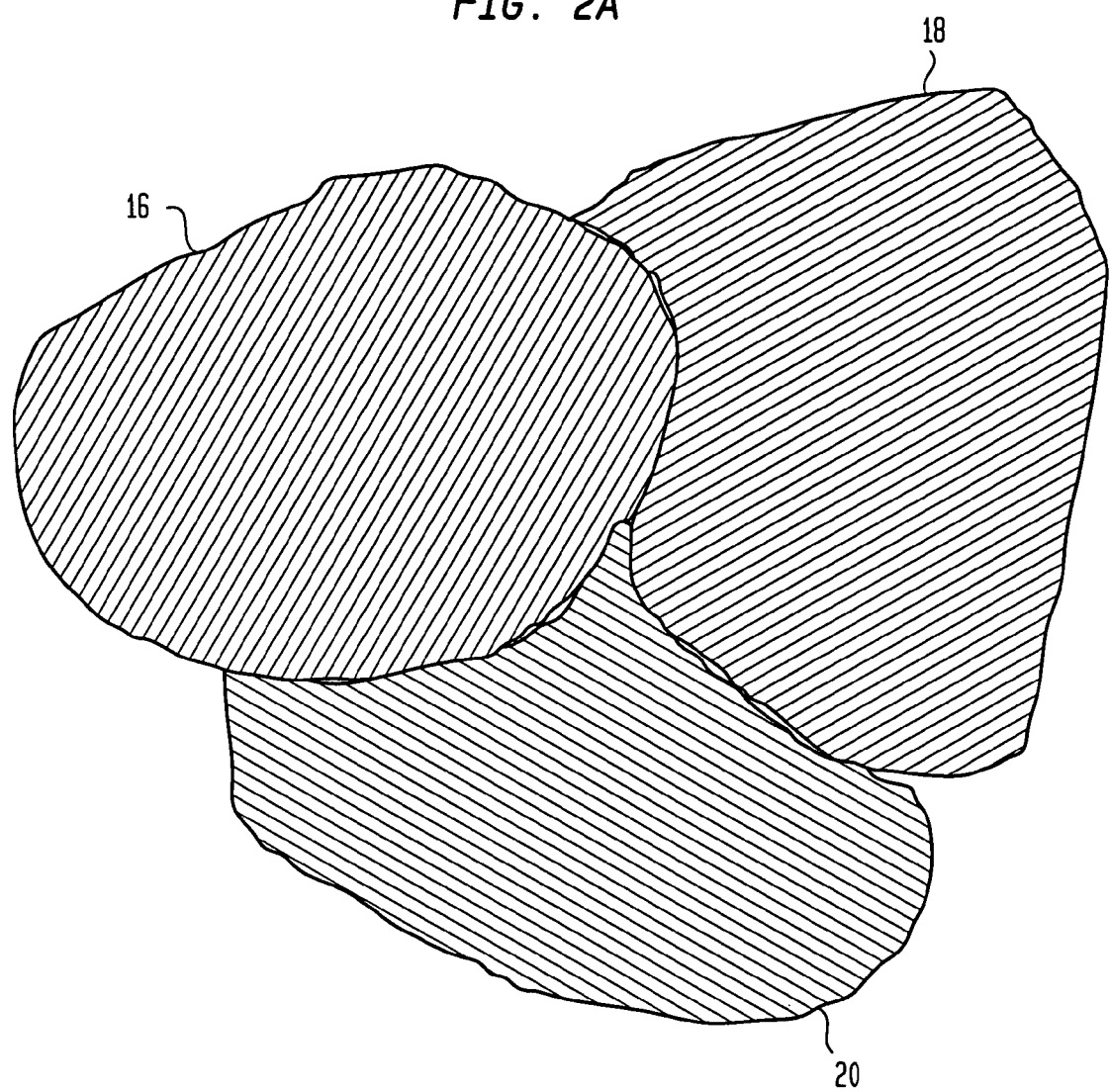

The occurrence of partial melting of the alloy's grains as a result of the above high temperature annealing step can be perhaps better understood by reference to FIGS. 2A and 2B. In particular, FIG. 2A schematically illustrates a plurality of grains 16, 18, and 20 of an alloy on which the teachings of the invention can be practiced prior to being subjected to the above-described elevated temperature. FIG. 2B schematically shows that subjecting the grains to the elevated temperature can cause formation of liquefied shells 16a, 18a, and 20a within each grain, which surround, respectively, solid core portions 16b, 18b and 20b. The core portions retain their solid phase at the elevated temperature. In other words, the high temperature annealing step can cause partial melting of the grains at portions in proximity of the grain boundaries. With reference to FIG. 2C, subsequent cooling of the sample and solidification of the liquefied portions results in grains having peripheral layers 16c, 18c and 20c, (layers formed as the liquefied shells solidify), each of which exhibits an average chemical composition that is different than that of its corresponding grain core. In other words, the above annealing and cooling steps can increase compositional heterogeneity of the grains. The different chemical composition of the peripheral layers relative to the grain cores can be generally characterized by a different relative concentration of the elements forming the alloy.

Figure 3:
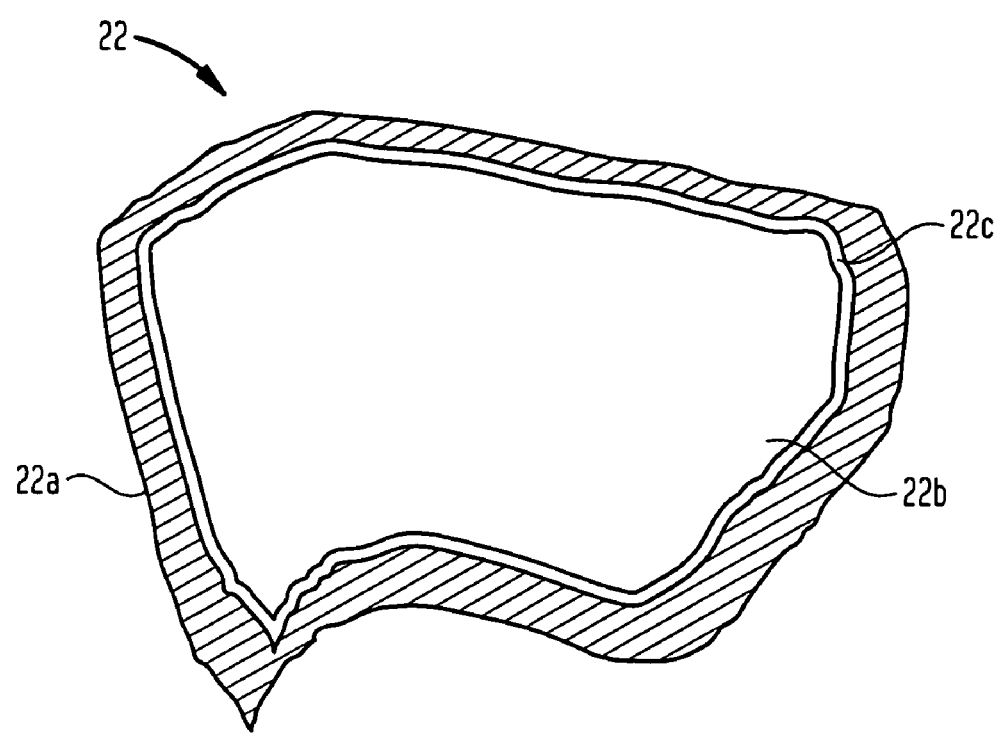
Figure 4:
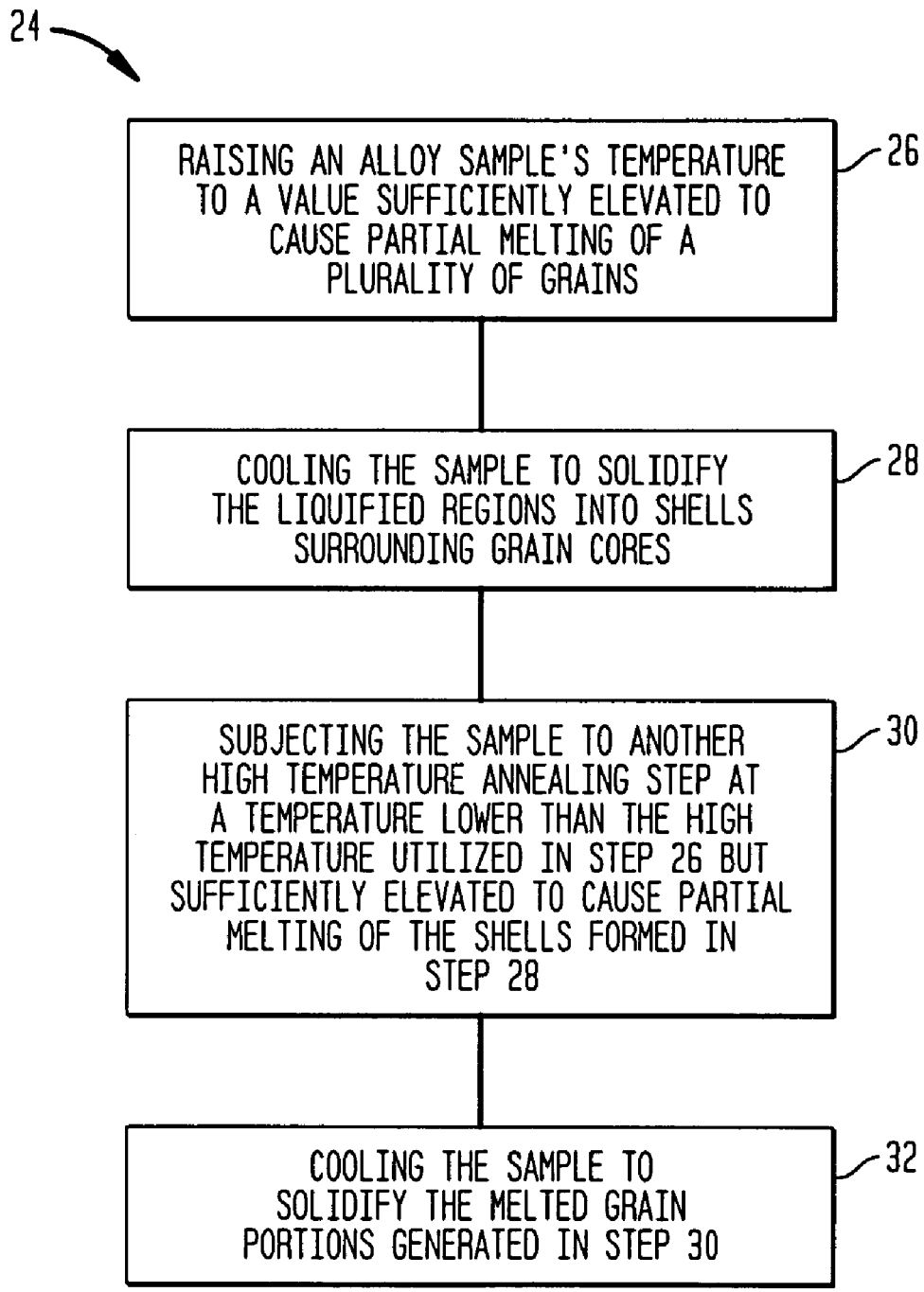
FIG. 4 is a flow chart depicting various steps in another embodiment of a method of the invention for improving thermoelectric properties of alloys, FIG. 5A schematically depicts a few grains of an alloy before application of the annealing and cooling cycles described in FIG. 4 thereto, FIG. 5B schematically illustrates the grains of FIG. 5A after application of the first annealing/cooling cycle of the method of FIG. 4 thereto, FIG. 5C schematically illustrates the grains of FIG. 5B after application of the second annealing/cooling cycle of the method described in FIG. 4 thereto.

Although a sharp boundary is depicted herein between each newly formed peripheral layer of a crystalline grain (i.e., layers formed as the liquid shells solidify) and the grain's core, the grain's chemical composition typically exhibits a gradual change, that is, a gradient, from the peripheral layer to the core. For example, as shown schematically in FIG. 3, in some cases, a heterogeneous grain 22 formed as a result of the above annealing and cooling steps may be characterized by a peripheral portion 22a and a core portion 22b having different average chemical compositions and a transitional portion 22c that exhibits a compositional gradient linking the peripheral composition to the core's composition.

In many embodiments, the duration of the high temperature annealing step is selected such that the above-described partial melting would occur without a substantial change in the sizes of the grains. Although this time duration can generally depend on the characteristics of an alloy sample, e.g., its chemical composition and its dimensions, it is typically selected to be in a range of about 1 minute to about 20 minutes, or in a range of about 1 minute to about 10 minutes. In general, the annealing duration is selected to allow sufficient partial melting of the grains to occur while avoiding noticeable structural deformation of the sample. In some embodiments, the annealing duration can be selected such that at a chosen elevated temperature, a liquefied peripheral layer of a grain would constitute a fraction of the grain's volume less than about 50%. For example, the annealing duration can be chosen such that the volume of the melted portion of a grain would constitute a fraction of the grain's volume in a range of about 1% to about 50%.

In some embodiments, the annealing temperature is kept a few percent (e.g., in a range of about 5% to 20%) below a temperature threshold above which the sample exhibits a purely liquid phase while ensuring that the temperature remains within a region characterized by a mixed solid/liquid phase. This temperature selection can ensure that structural deformations, if any, caused by the high temperature anneal would be minimal.

It has been discovered that subjecting an alloy to the above high temperature annealing step can enhance its thermoelectric properties. As noted above, a thermoelectric figure-of-merit (Z), or a dimensionless figure-of-merit (ZT), can be employed as indicators of coefficient-of-performance (COP) (for refrigeration applications) or efficiency (for power generation applications) of a thermoelectric alloy. As discussed in more detail below, the above-described high temperature annealing of an alloy can advantageously increase its Z, or ZT, by decreasing the alloy's thermal conductivity and/or enhancing its electrical conductivity. In many embodiments, the alloy's thermal conductivity is decreased while its electrical conductivity is increased (or remains substantially unchanged)

Without being limited to any particular theory, the methods of the invention can impart an enhanced compositional heterogeneity to an alloy (e.g., they cause formation of additional compositional phases and their associated grain boundaries), thereby significantly enhancing phonon scattering. The increased phonon scattering can in turn result in a decrease in the alloy's thermal conductivity. Further, in many cases, the sample's electrical conductivity is enhanced (or remains substantially unchanged). These changes in the alloy's thermal and/or electrical conductivities can in turn result in an improved thermoelectric figure-of-merit. By way of example, the methods of the invention can improve the thermoelectric ZT of an alloy by a factor in a range of about 10 percent to about 400 percent, or more preferably in a range of about 20 percent to about 400 percent.

Figure 5A:
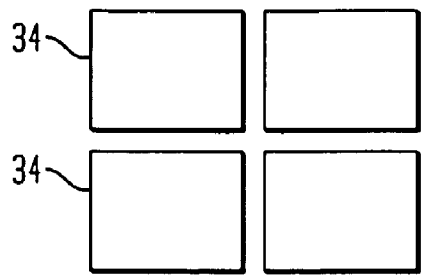
Figure 5B:
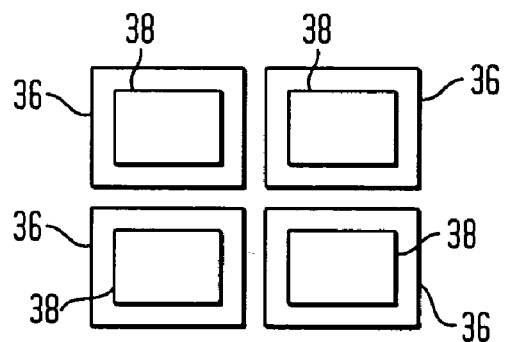

In some embodiments, the above high temperature annealing and cooling steps are iterated, albeit with each subsequent annealing step performed at a lower temperature than a previous annealing step, so as to generate a plurality of grain regions having different average chemical compositions from one another and from that of the grain core. By way of example, with reference to a flow chart 24 of FIG. 4 and FIG. 5A-5C, in one such embodiment, in an initial step 26, an alloy sample's temperature is raised to a value sufficiently elevated to cause partial melting of a plurality of grains 34 in regions proximate to the grain boundaries (while only a few grains are shown schematically as squares for ease of illustration, those skilled in the art appreciate it that a sample can include many more grains having typically irregular shapes). As in the previous embodiment, this elevated temperature can be selected to be in a range in which a phase diagram of the alloy sample exhibits a solid/liquid phase. In a subsequent step 28, the high temperature annealing is followed by cooling the sample to solidify the liquefied regions into shells 36 surrounding grain cores 38, shown schematically in FIG. 5B.

Referring again to the flow chart 24, in a subsequent step 30, the sample is subjected to another high temperature annealing step at a temperature lower than that utilized the first annealing step 26, but still sufficiently elevated to cause partial melting of the shells 36 generated by solidifying the grain portions melted during the first high temperature anneal. For example, the temperature can be selected to be in a region in which the phase diagram of an alloy with the average chemical composition of the shells 34 exhibits a solid/liquid phase (i.e., greater than a low threshold temperature below which the shells exhibit a purely solid phase and less than a high threshold temperature above which the shells exhibit a purely liquid phase) but less than the temperature utilized in the previous annealing step. Following this second high temperature annealing, in step 32, the sample is cooled to solidify the liquefied portions into peripheral regions 40, shown schematically in FIG. 5C, having a different average chemical composition than those of the shell portions 36 and the core portions 38. In this manner, three compositional phases are generated within the grains that impart a high degree of heterogeneity to the grains, thereby enhancing thermoelectric properties of the sample.

Figure 5C:
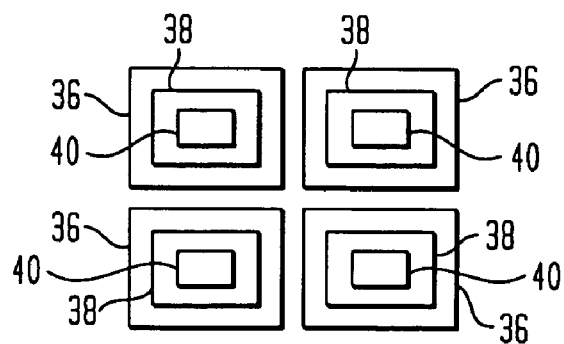

Although sharp boundaries are schematically depicted in FIG. 5C between grain regions 40 and 36, and between the regions 36 and 38, in many embodiments, the transition between any two of these regions can be characterized by a compositional gradient. Further, similar to the previous embodiment, each annealing step can be performed for a duration sufficient to cause the desired partial melting of the grains but short enough to avoid substantial structural deformation of the sample. For example, each annealing step can be performed for a time duration in a range of about 1 minute to about 20 minutes, or in a range of about 1 minute to about 10 minutes.

Further, the number of iterations of the annealing/cooling cycles is not limited to that described above. In particular, additional compositional phases can be generated in the grains by subjecting the alloy to further annealing/cooling cycles in a manner described above. In addition, similar to the previous embodiment, the high temperature annealing steps are preferably performed in an inert atmosphere to inhibit oxidation of the sample.

Figure 6:
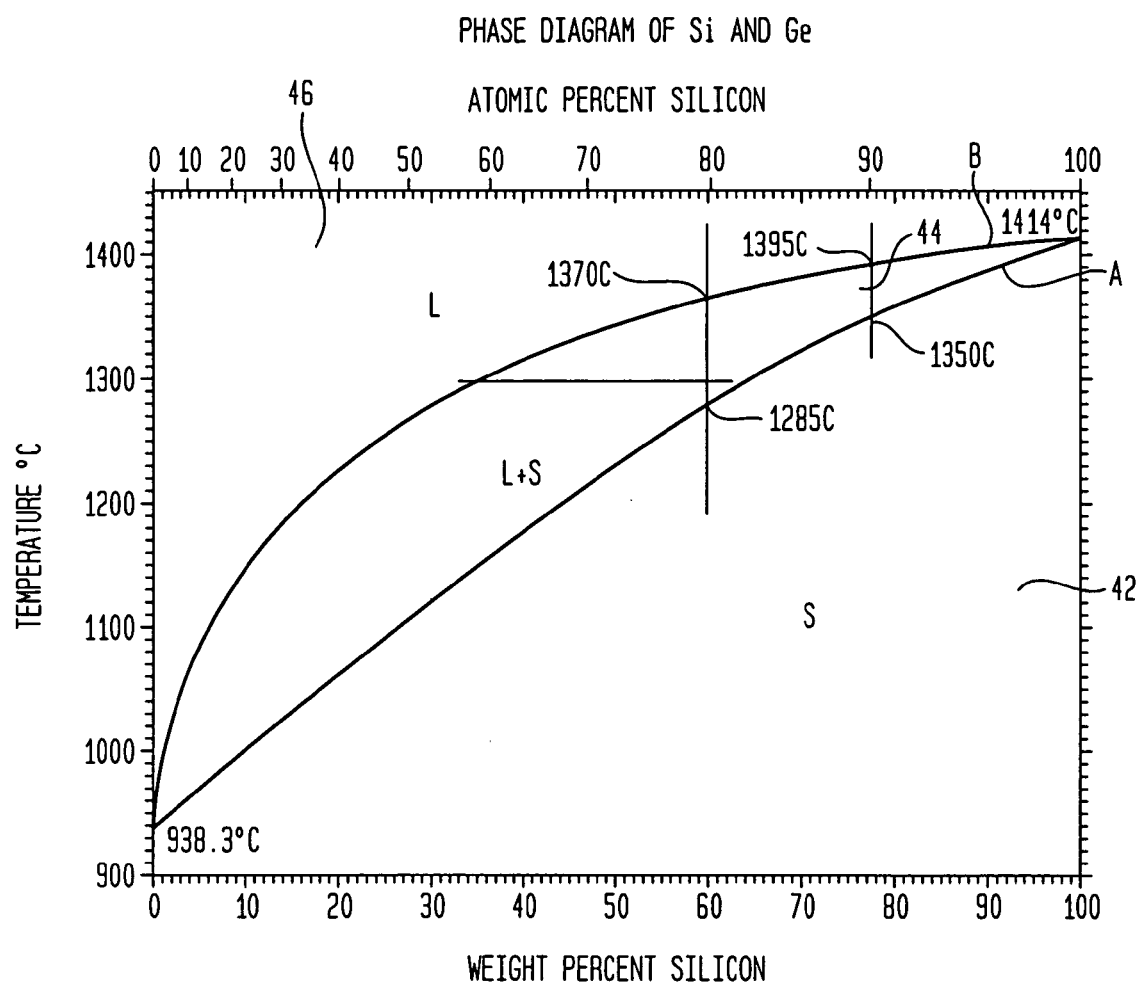
FIG. 6 is a SiGe phase diagram.

The methods of the invention can be applied to a variety of different alloys to improve their thermoelectric properties. For example, the above annealing/cooling steps can be applied to SiGe alloys. FIG. 6 shows the phase diagram of SiGe alloys for a range of relative concentrations of Si and Ge (the upper horizontal axis is based on relative atomic concentration of silicon in the alloy and the lower horizontal axis is based on relative weight concentration of silicon). The phase diagram is characterized by two phase boundary curves A and B. The curve A separates a portion 42 of the phase diagram in which the alloys exhibit a purely solid phase from a portion 44 characterized by a mixed liquid/solid phase. And the curve B separates the liquid/solid phase portion 44 from a portion 46 of the phase diagram in which the alloys exhibit a purely liquid phase. For each relative concentration of Si and Ge, the methods of the invention can be practiced by annealing the alloy at a temperature corresponding to the liquid/solid phase portion 44.

By way of example and to show the efficacy of the methods of the invention for enhancing thermoelectric properties of alloys, a sample of $Si_{0.8}Ge_{0.2}$ (relative concentrations are given in terms of atomic percent) was subjected to a temperature of about 1320° C. for about 10 minutes. As can be seen from the phase diagram, a Si/Ge alloy having a relative Si atomic concentration of 0.8 and a relative Ge atomic concentration of 0.2 exhibits a mixed solid/liquid phase at this temperature. That is, subjecting the $Si_{0.8}Ge_{0.2}$ alloy to this elevated temperature causes partial melting of the alloy's grains. As can be ascertained from the phase diagram, the liquefied and solid portions exhibit different relative concentrations of silicon and germanium at this temperature. Subsequently, the $Si_{0.8}Ge_{0.2}$ sample was cooled to solidify the liquefied portions. Table 1 below presents the measured thermoelectric ZT for this sample relative to a similar untreated control $Si_{0.8}Ge_{0.2}$ sample:

TABLE 1

| $Si_{0.8}Ge_{0.2}$ (n-type) | Thermal Conductivity (W/mK) | Seebeck Coefficient (µV/K) | Electrical Conductivity (S/m) | ZT (300 K) |
|---|---|---|---|---|
| Control (not subjected to annealing) | 7.6 | −96 | 33,000 | 0.012 |
| Annealed at 1320° C. | 6.9 | −100 | 100,000 | 0.046 |

The data presented in the above table indicates that the annealed sample exhibits a thermal conductivity that is about 9% less than that of the untreated sample, and an electrical conductivity that is significantly greater than that of the untreated sample. Accordingly, the annealed sample exhibits a figure-of-merit (ZT) that is significantly enhanced relative to that of the untreated sample.

By way of another example, Table 2 below presents exemplary comparative data corresponding to thermoelectric properties of a $Si_{0.9}Ge_{0.1}$ sample subjected to an annealing/cooling cycle in accordance with the teachings of the invention and a control sample having the same relative atomic concentrations of silicon and germanium. More specifically, the annealed sample was subjected to an elevated temperature of 1365° C. for about 10 minutes and subsequently cooled. Reference to the phase diagram of FIG. 6 shows that a SiGe alloy having a relative silicon atomic concentration of 0.9 and a relative germanium atomic concentration of 0.1 exhibits a liquid/solid phase at this elevated temperature. In other words, this temperature lies in a range of about 1350° C. and 1395° C., which characterizes temperature values above those at which the $Si_{0.9}Ge_{0.1}$ alloy sample exhibits a purely solid phase and below those at which the sample exhibits a purely liquid phase.

TABLE 2

| $Si_{0.9}Ge_{0.1}$ (n-type) | Thermal Conductivity (W/mK) | Seebeck Coefficient (µV/K) | Electrical Conductivity (S/m) | ZT (300 K) |
|---|---|---|---|---|
| Control (not subjected to annealing) | 9.73 | −140 | 105,200 | 0.063 |
| Annealed at 1345° C. | 7.67 | −155 | 76,800 | 0.072 |
| Annealed at 1365° C. | 6.00 | −151 | 84,500 | 0.096 |

The data presented in the above Table 2 indicates that the annealed sample exhibits a lower thermal conductivity and a higher electrical conductivity relative to the control sample (i.e., the sample that is not annealed), resulting in a thermoelectric ZT that is significantly greater than that of the control sample.

It should be understood that the above exemplary data is provided only for illustrative purposes and is not intended to necessarily show optimal enhancements of an alloy's thermoelectric properties that can be achieved by employing the teachings of the invention.

Figure 7:
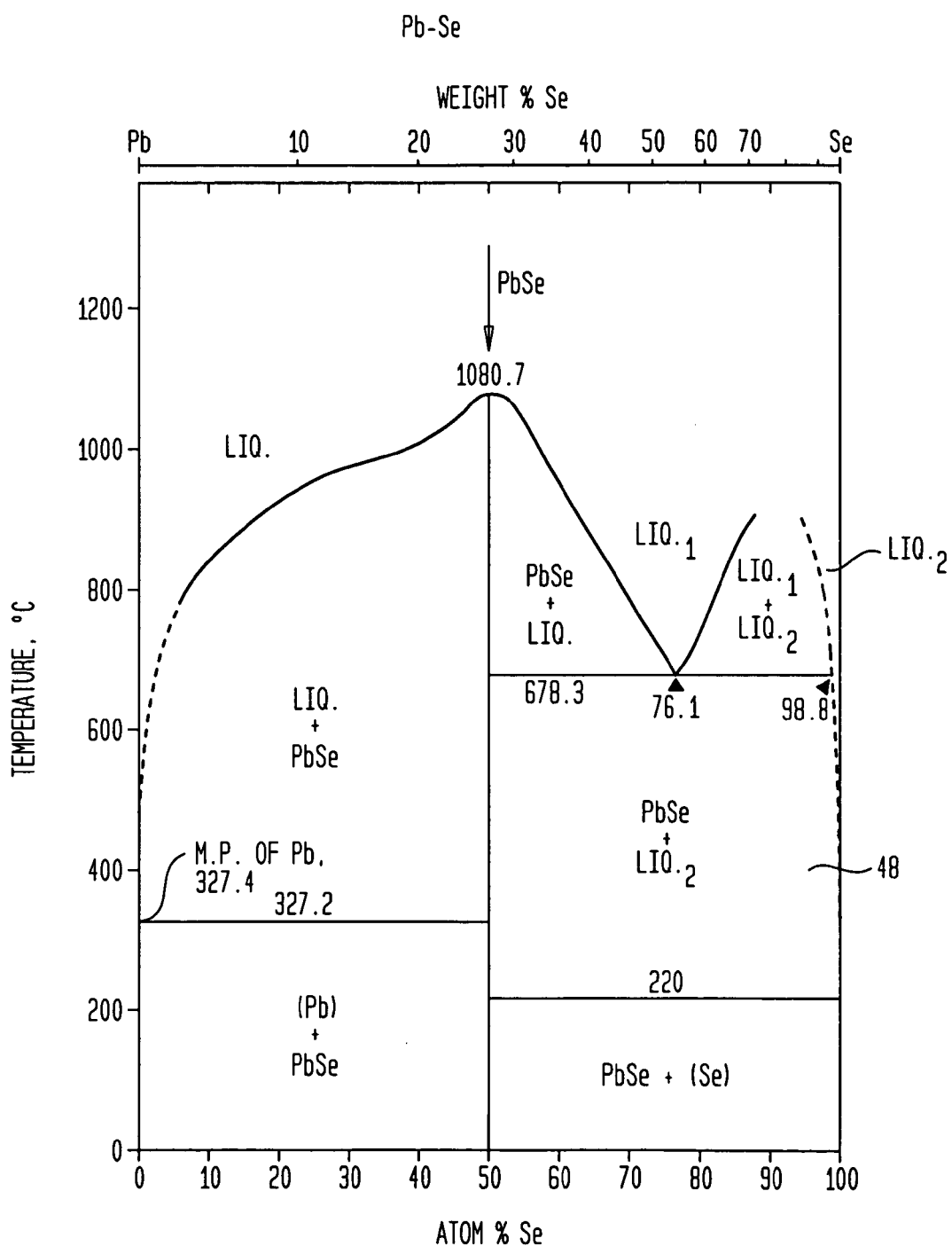
FIG. 7 is a PbSe phase diagram.
Figure 8:
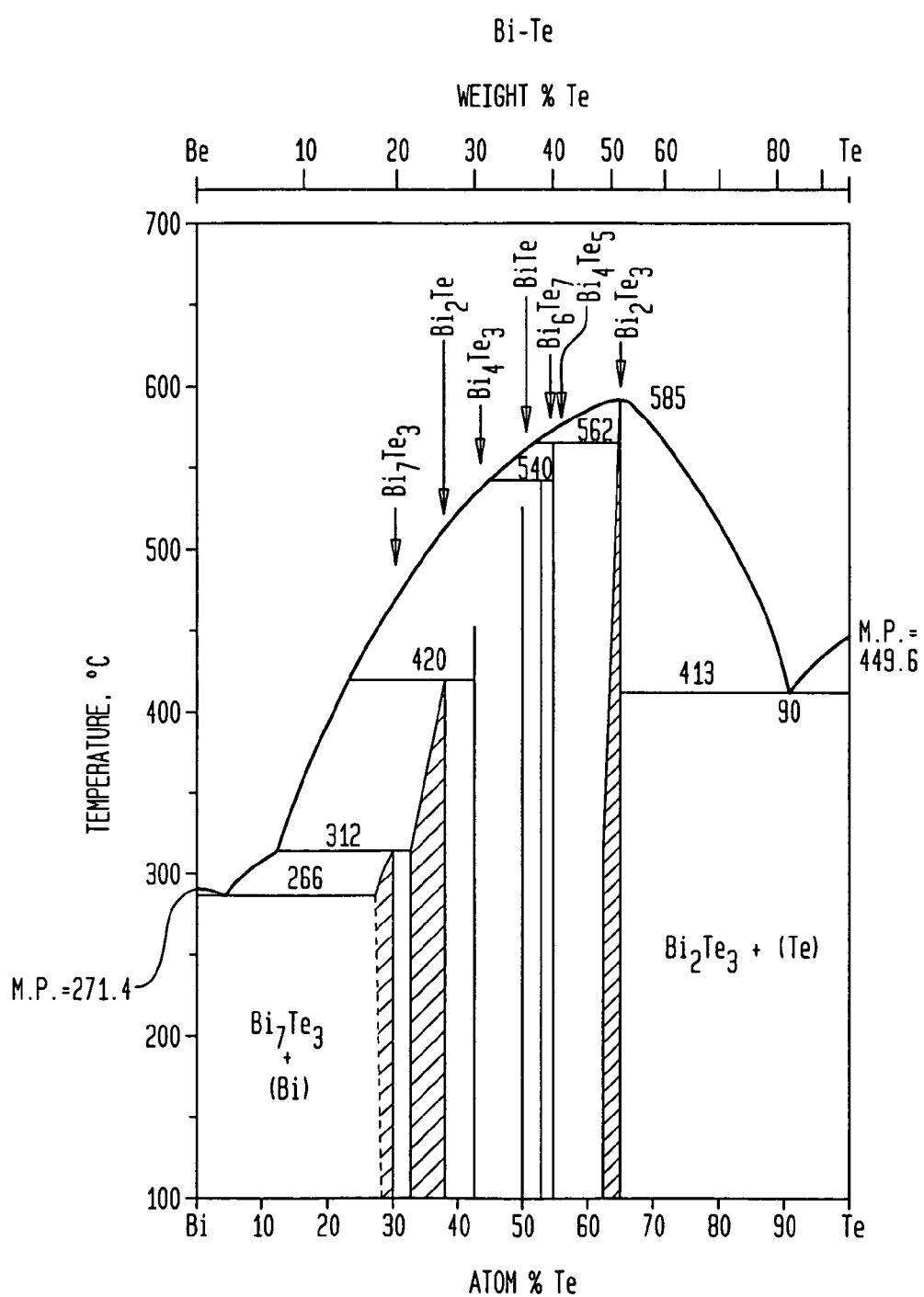
FIG. 8 is a BiTe phase diagram.
Figure 9:
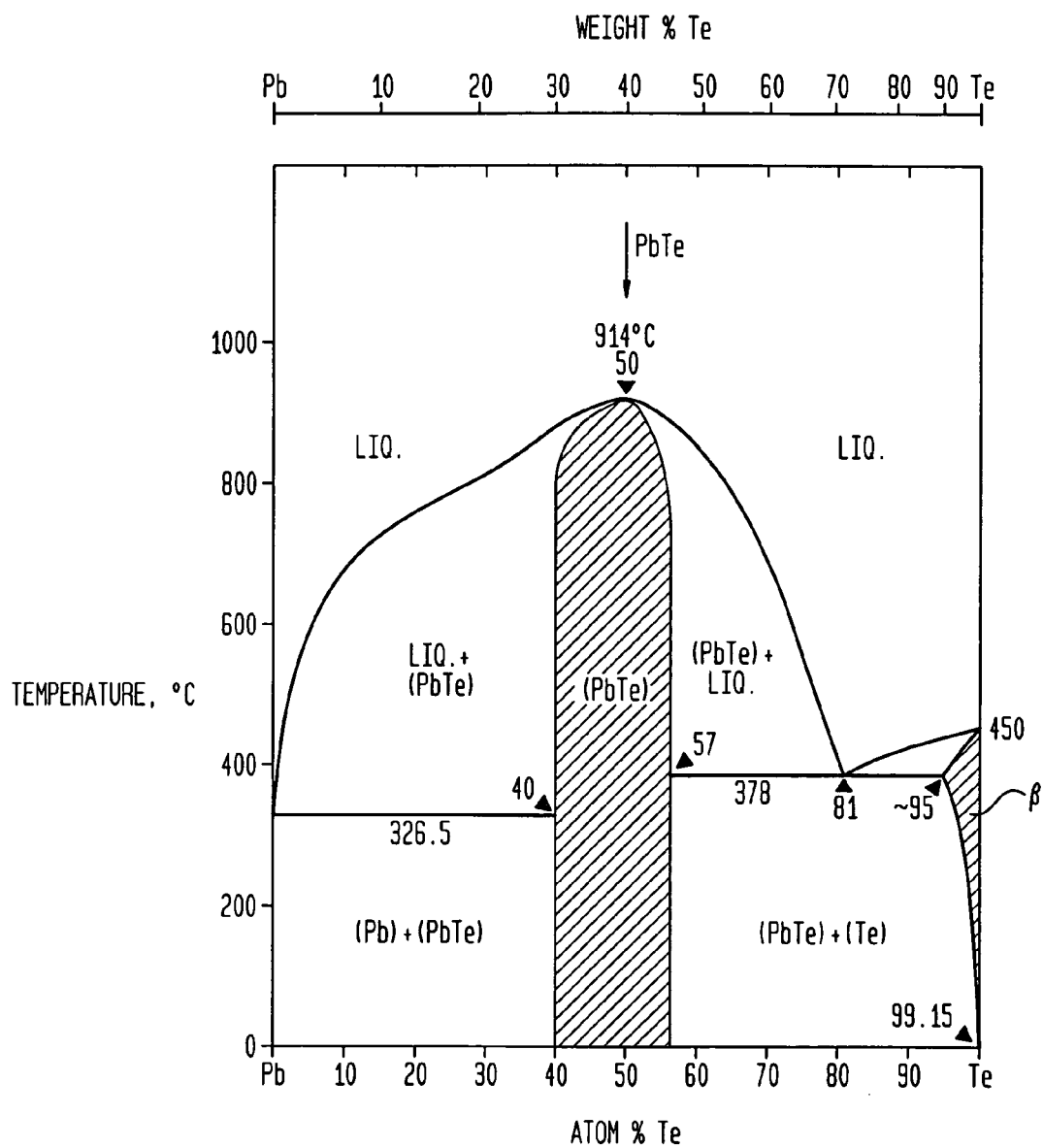
FIG. 9 is a PbTe phase diagram.
Figure 10:
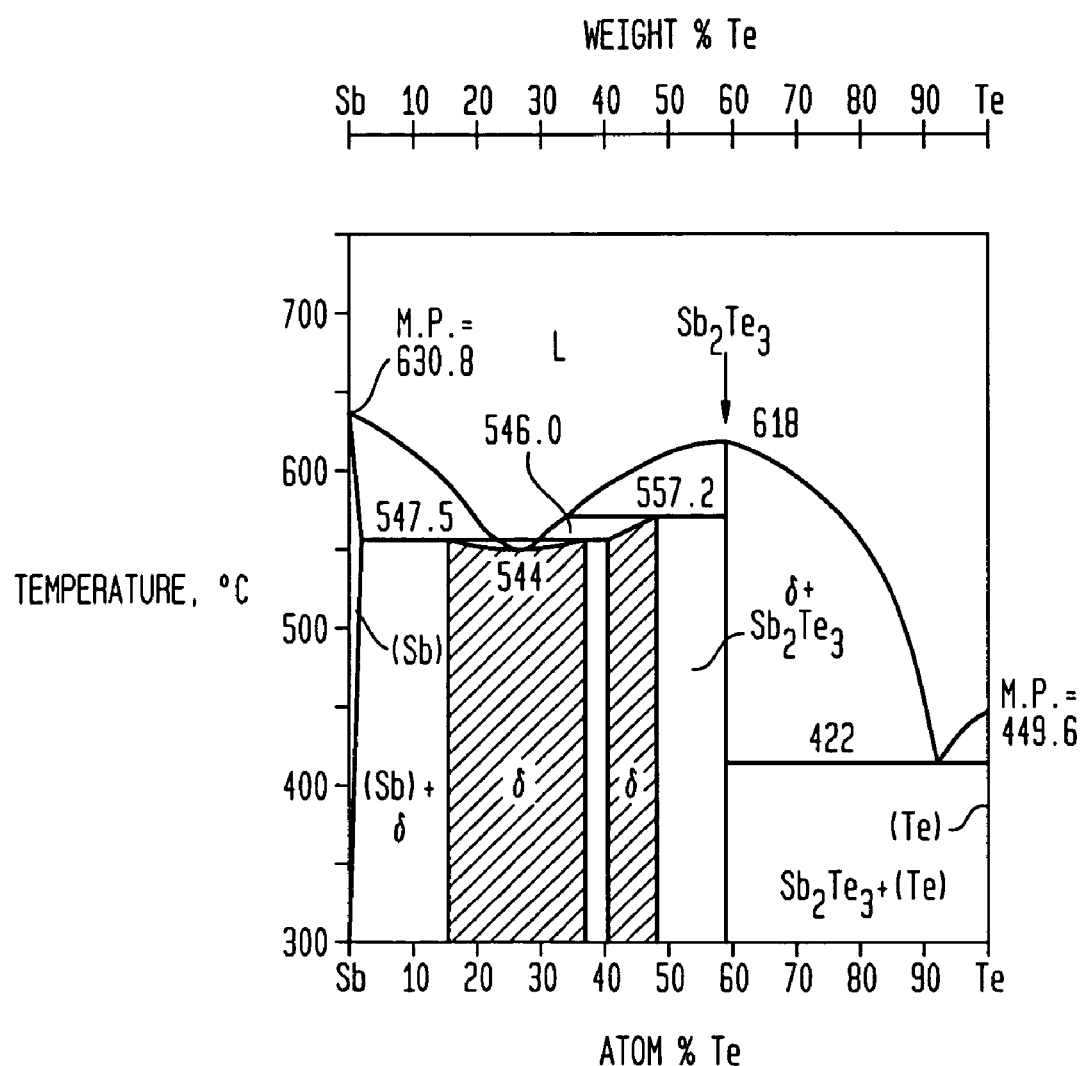
FIG. 10 is a SbTe phase diagram, and FIG. 11 schematically illustrates an oven in which an alloy sample can be subjected to a high temperature annealing in accordance with the teachings of the invention.

Further, the applications of the methods of the invention are not limited to SiGe alloys. In fact, as noted above, they can be practiced on a variety of alloys to enhance their thermoelectric properties. Some examples of such alloy systems include, without limitation, Pb—Te, Sb—Te, Pb—Se and Bi—Te, which are routinely utilized in forming thermoelectric devices. For example, with reference to a phase diagram of Pb—Se (at an ambient pressure of 1 atm) shown in FIG. 7, a $Pb_{0.4}Se_{0.6}$ alloy sample can be subjected to a high temperature above 220° C. within a range characterized by a mixed solid/liquid phase (e.g., within region 48), and subsequently cooled. For example, the elevated temperature can be maintained above about 220° C. (below which the sample would exhibit a purely solid phase characterized by two components, namely, PbSe and Se) and below about 678° C. (above which the sample would exhibit liquid phase). Similar to the previous embodiments, the duration of the high temperature exposure is selected so as to avoid any noticeable structural deformation of the sample. Similarly, the phase diagrams of BiTe, PbTe, and SbTe (at a pressure of 1 atm), presented respectively in FIGS. 8, 9 and 10, show phase regions in which partial melting of the alloy can be achieved, that is, phase regions that can be utilized for practicing the teachings of the invention for improving the alloy's thermoelectric properties.

The above methods of the invention can be practiced not only on bulk alloys but also on thermoelectric compositions exhibiting nano-sized structures. Some examples of such nanocomposite thermoelectric materials are disclosed in a co-pending U.S. patent application Ser. No. 10/977,363 entitled "Nanocomposites With High Thermoelectric Figures of Merit" filed on Oct. 29, 2004, which is herein incorporated by reference in its entirety. These nanocomposite materials typically exhibit a high degree of heterogeneity and good thermoelectric properties. Their thermoelectric properties, however, can be further enhanced by employing high temperature annealing steps followed by cooling steps, such as those described in detail above.

Figure 11:
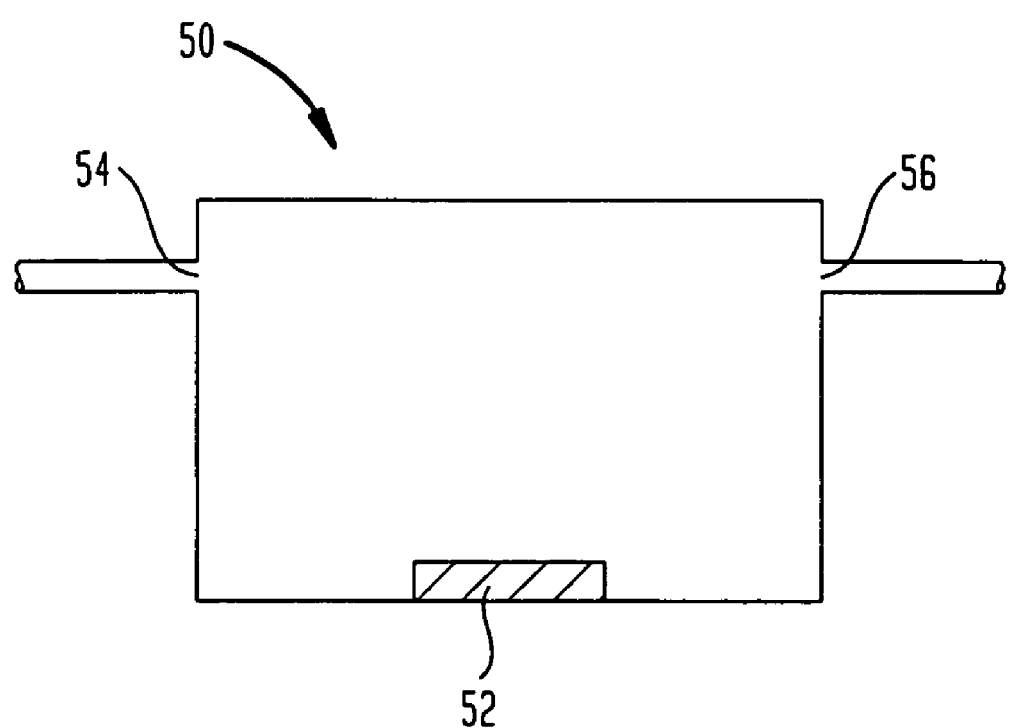

A variety of systems can be utilized to practice the methods of the invention, such as the embodiments described above. By way of example, FIG. 11 schematically depicts an oven 50 that can be employed in many embodiments of the invention for exposing an alloy sample 52 to an elevated temperature selected in a manner described above to cause partial melting of the alloy's grains. In this exemplary embodiment, an input port 54 allows introducing a gas, preferably a noble gas such as argon, into the oven's chamber and an output port 56 allows egress of the gas from the chamber. In this manner, a flow of a suitable gas can be established over the alloy sample. The gas is typically selected to generate an inert atmosphere within the oven chamber so as to inhibit oxidation of the sample, which otherwise may readily occur at elevated temperatures. A variety of ovens suitable for use in the practice of the invention are known.

Those having ordinary skill in the art will appreciate that various modifications can be made.

What is claimed is:

1. A method of improving a thermoelectric property of an alloy having a plurality of grains, comprising
heating the alloy to a temperature at which the alloy exhibits a mixed solid/liquid phase so as to cause partial melting of at least some of the grains such that a boundary layer of a grain is melted about an unmelted core,
cooling the alloy such that the melted portions solidify and exhibit a chemical composition different than that of the unmelted cores,
wherein said heating temperature is selected to be less than a threshold temperature above which the alloy exhibits a purely liquid phase by a value in a range of about 5% to about 20% of the threshold temperature.

2. The method of claim 1, wherein said different chemical composition is characterized by a different average relative concentration of chemical elements forming the alloy.

3. The method of claim 1, wherein the step of heating the alloy further comprises subjecting the alloy to an elevated temperature for a duration such that the melted portion of a grain comprises a volume fraction of the grain less than about 50%.

4. The method of claim 3, further comprising selecting said duration such that a melted grain portion comprises a volume fraction of the grain in a range of about 1% to about 50%.

5. The method of claim 3, further comprising selecting said duration to be in a range of about 1 minute to about 20 minutes.

6. The method of claim 1, wherein said improved thermoelectric property is characterized by the dimensionless thermoelectric ZT.

7. The method of claim 6, wherein said partial meting and solidification of the melted portions results in an increase in said figure-of-merit in a range of about 10 percent to about 400 percent.

8. The method of claim 1, further comprising selecting said alloy to be any of a silicon/germanium, a bismuth/tellurium, a lead/selenium, antimony/tellurium or a lead/tellurium alloy.

9. The method of claim 1, further comprising maintaining the alloy in an inert atmosphere while exposing it to said elevated temperature.

10. The method of claim 9, wherein the step of maintaining the alloy in an inert atmosphere comprises flowing an inert gas over the sample.

11. A method for enhancing a thermoelectric property of an alloy having a polycrystalline structure characterized by a plurality of grains, comprising:
annealing the alloy at a temperature at which the alloy exhibits a mixed solid/liquid thermodynamic phase and sufficiently elevated to cause a solid-to-liquid phase change at the periphery of a plurality of the grains such that liquefied boundary layers are formed that exhibit an average chemical composition different than that of unliquified core portions of the corresponding grains, and
cooling said alloy so as to solidify said liquid boundary layers,
wherein said heating temperature is selected to be less than a threshold temperature above which the alloy exhibits a purely liquid phase by a value in a range of about 5% to about 20% of the threshold temperature.

12. The method of claim 11, further comprising selecting a duration of said annealing step such that a liquefied grain boundary layer comprises a fraction of the grain volume less than about 50%.

13. The method of claim 11, further comprising selecting a duration of said annealing step such that each liquefied boundary layer comprises a fraction of the grain volume in a range of about 1% to about 50%.

14. The method of claim 11, further comprising selecting said alloy to be any of a SiGe, a bismuth telluride, a lead selenide, an antimony telluride or a lead telluride alloy.

15. The method of claim 11, further comprising selecting said alloy to be $Si_{0.8}Ge_{0.2}$ and selecting said annealing temperature to be in a range of about 1285° C. to about 1350° C.

16. The method of claim 11, further comprising performing said annealing step for a duration in a range of about 1 minute to about 30 minutes.

17. The method of claim 11, further comprising performing said annealing step for a duration in a range of about 1 minute to about 20 minutes.

18. A method of improving a thermoelectric figure-of-merit of a polycrystalline alloy characterized by a plurality of grains, comprising
annealing the alloy at a sufficiently elevated first temperature so as to liquefy peripheral layers of a plurality of its grains while maintaining core portions of these grains in a solid phase,
cooling said alloy to solidify said liquefied layers into shells surrounding said solid cores, each shell having a different average chemical composition than the core it surrounds,
subsequently, annealing the alloy at a sufficiently elevated second temperature less than the first temperature so as to liquefy peripheral layers of the shells while maintaining the remainder of the shells and their associated cores in a solid phase, and
cooling said alloy to solidify said liquefied peripheral layers,
wherein said first elevated temperature is selected to be less than a threshold temperature above which the alloy exhibits a purely liquid phase by a value in a range of about 5% to 20% of the threshold temperature.

19. The method of claim 18, wherein said first and second elevated temperatures are selected to be in a range in which said alloy exhibits a mixed solid/liquid phase.

20. The method of claim 18, wherein said shells exhibit an average chemical composition different than the cores they surround.

21. The method of claim 20, wherein each peripheral layer of a shell has an average chemical composition different that that of the remainder of the shells.

22. A method of reducing thermal conductivity in a thermoelectric alloy with a plurality of grains, the method comprising
thermally cycling the alloy between an upper temperature in which the alloy exhibits a mixed liquid-solid phase and a lower temperature in which the alloy exhibits a solid phase such that at least a plurality of the grains are partially melted and peripheral boundary layers are formed around the partially melted grains, said boundary layers having a different chemical composition than core regions of the partially melted grains,
wherein said upper temperature is selected to be less than a threshold temperature above which the alloy exhibits a purely liquid phase by a value in a range of about 5% to about 20% of the threshold temperature.

23. The method of claim 22, wherein thermal cycling is repeated to form multiple shells around at least some of the partially melted grains, each shell having a different chemical composition.

* * * * *

UNITED STATES PATENT AND TRADEMARK OFFICE
CERTIFICATE OF CORRECTION

| | | |
|---|---|---|
| PATENT NO. | : 7,591,913 B2 | Page 1 of 1 |
| APPLICATION NO. | : 11/100950 | |
| DATED | : September 22, 2009 | |
| INVENTOR(S) | : Zhifeng Ren et al. | |

It is certified that error appears in the above-identified patent and that said Letters Patent is hereby corrected as shown below:

Title Page; item (75); should read;

\*\*INVENTORS:

\*\*Shankar Kunwar, Newton, MA

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO.      : 7,591,913 B2
APPLICATION NO. : 11/100950
DATED           : September 22, 2009
INVENTOR(S)     : Ren et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 955 days.

Signed and Sealed this

Fourteenth Day of December, 2010

David J. Kappos
*Director of the United States Patent and Trademark Office*